(12) United States Patent
Koprowski et al.

(10) Patent No.: US 6,442,720 B1
(45) Date of Patent: Aug. 27, 2002

(54) TECHNIQUE TO DECREASE THE EXPOSURE TIME OF INFRARED IMAGING OF SEMICONDUCTOR CHIPS FOR FAILURE ANALYSIS

(75) Inventors: Timothy J. Koprowski, Newburgh; Mary P. Kusko, Hopewell Junction; Richard F. Rizzolo, Red Hook; Peilin Song, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/326,226

(22) Filed: Jun. 4, 1999

(51) Int. Cl.[7] ............................................. G01R 31/28
(52) U.S. Cl. ............................................. 714/726
(58) Field of Search ............................... 714/724, 744, 714/726, 733, 736, 815; 342/752, 158.1; 250/311, 214 VT; 313/365, 537; 347/86; 327/203, 408, 752; 326/14

(56) References Cited

U.S. PATENT DOCUMENTS

| | | | |
|---|---|---|---|
| 3,761,695 A | | 9/1973 | Eichelberger |
| 3,783,254 A | | 1/1974 | Eichelberger |
| 4,071,902 A | | 1/1978 | Eichelberger |
| 4,431,914 A | * | 2/1984 | Mourou et al. ......... 250/214 R |
| 4,688,223 A | | 8/1987 | Motika |
| 5,278,842 A | | 1/1994 | Berry |
| 5,386,423 A | * | 1/1995 | Koo et al. ................ 714/726 |
| 5,617,426 A | * | 4/1997 | Koenemann et al. ....... 714/726 |
| 6,172,512 B1 | * | 1/2001 | Evans et al. ............... 324/752 |
| 6,217,165 B1 | * | 4/2001 | Silverbrook ............... 347/86 |

OTHER PUBLICATIONS

NN880495: (Simplified Digital Waveforms for Timing and Delay Fault Simulation of Large–Scale Integrated Circuits; IBM Technical Disclosure Bulletin, vol. #30, pp. #: 95–102; Apr. 1988, US).*

NA9306501: (L2 Latch Design for Detecting Transition Faults; IBM Technical Disclosure Bulletin, vol. # 36, pp. #: 501–504; Jun. 1993, US).*

Konemann (A pattern skipping method for weighted random pattern testing; IEEE, Apr. 1993; pp. 418–425).*

(List continued on next page.)

*Primary Examiner*—Albert Decady
*Assistant Examiner*—Guy Lamarre
(74) *Attorney, Agent, or Firm*—Lynn Augspurger; Cantor Colburn LLP (57) ABSTRACT

The present invention can include a method and system for testing IC chips, including the steps of performing a binary search to a first failing pattern, determining a failing sink latch, performing a back cone trace to determine all source latches, determining source latch logic states, positioning the source latch logic states in a scan chain, exercising a chip scan path by applying logic transitions on the source latches in the absence of a system L1 clock, and observing an exercised failing circuit. The invention can include the use of PICA techniques to observe the exercised failing circuit. In another embodiment, the invention can include using LBIST or a WRP technique to search for the failing pattern. In yet another it includes the step of using an algorithm to exercise the exercised failing circuit. In another embodiment, the method includes the step of creating a net pattern to be scanned including a sum of an original pattern causing a failing circuit to be exercised, and one or more shifted versions of the original pattern. The algorithm can include a step where one of the shifted versions is shifted a number of clocks wherein the number of clocks is equal to the length of the original pattern. In one embodiment, one of the shifted versions is shifted a number of clocks, wherein the number of clocks is chosen so that the sum of the original pattern and the one of the shifted versions does not cause a scan conflict. In another embodiment the method further includes the step of using an algorithm to densify the pattern set.

14 Claims, 9 Drawing Sheets

OTHER PUBLICATIONS

Odabas–Geldiay et al. (An integrated DSP–based architecture for FLIP optical scanning mirror calibration and control; IEEE, Dec. 1994; pp. 299–311).*

Bardell et al., "Self–Testing of Multichip Logic Modules" 1982 IEEE Test Conference, Paper 9.3, pp 200–204.

Tsang et al., "Picosecond Hot Electron Light Emission from Submicron Complementary Metal–Oxide–Semiconductor Circuits" 1997 Appl. Phys. Lett. 70 (7) pp 889–891.

Kash et al., "Dynamic Internal Testing of CMOS Circuits Using Hot Luminescence" 1997 Electron Device Letters, vol. 18, No. 7, pp 330–332.

Kash et al. "Backside Optical Emission Diagnostics for Excess IDDQ" 1998 IEEE Journal of Solid–State Circuits, vol. 33, No. 3, pp 508–511.

Knebel et al., "Diagnosis and Characterization of Timing–Related Defects By Time–Dependent Light Emission," 1998 IEEE International Test Conference, Paper 30.1, pp 733–739.

Vallett et al., "Watching Chips Work" 1998, MicroNews, vol. 4, pp 23–25.

* cited by examiner

TECHNIQUE TO DECREASE THE EXPOSURE TIME OF INFRARED IMAGING OF SEMICONDUCTOR CHIPS FOR FAILURE ANALYSIS

FIELD OF THE INVENTION

The present invention relates to testing of integrated circuit (IC) chips, and more particularly to failure analysis of semiconductor IC chips. More particularly, this invention relates to an improved testing technique for testing IC chips using picosecond imaging circuit analyzer(PICA) techniques.

TRADEMARKS

S/390 and IBM are registered trademarks of International Business Machines Corporation, Armonk, N.Y., U.S.A. and Lotus is a registered trademark of its subsidiary Lotus Development Corporation, an independent subsidiary of International Business Machines Corporation, Armonk, N.Y. Other names may be registered trademarks or product names of International Business Machines Corporation or other companies.

BACKGROUND

Very large scale integration (VLSI) logic integrated circuit (IC) chips, e.g. microprocessors, contain very large numbers of logic circuits. Testing the many logic circuits in a chip is an important part of the manufacturing process of the chip.

Logic circuits typically include many interconnected logic gates. The various logic gates include, e.g., "AND" gates, "OR" gates, "NAND" gates, "NOR" gates, "NOT" gates, "XOR" gates and so on. A logic circuit has a number of inputs for receiving data, and a number of outputs for outputting data. The logic circuit is designed such that for each input pattern, of a set of one or more input patterns, provided at the inputs of the logic circuit, a corresponding predetermined output pattern is produced at the outputs of the circuit.

If there is a fault or defect in the logic circuit, then for one or more input patterns provided at the inputs of the circuit, the observed output patterns produced at the outputs of the circuit will differ from the expected predetermined output patterns.

One way to test for faults in a logic circuit is to apply each possible input pattern at the inputs of the logic circuit, and to compare the actual output pattern with the expected output pattern. For small numbers of possible input patterns, the cost of storing the expected output patterns and performing this deterministic testing is reasonable. However, for large numbers of possible input patterns, the cost of such deterministic testing is too high.

An alternative method of testing for faults in a logic circuit applies random input test patterns at the inputs of the logic circuit, and compares the actual output patterns with the expected output patterns. The number of random test patterns needed to achieve a selected level of confidence that a logic circuit contains no faults depends on the circuit design.

Another alternative method of testing for faults in a logic circuit applies one or more weighted random input test patterns at the inputs of a logic circuit, and compares the actual output patterns with the expected output patterns. The weights may be uniform across all digits in the test pattern, or the weights may be nonuniform. The weighted random test patterns are selected to achieve, efficiently and at a low cost, a desired level of confidence that the logic circuit contains no faults.

As integrated circuit chip devices have become more densely packed with electronic components and more complex, the need for effectively testing such circuits has become more important. This is especially true of digital logic circuits. In order to provide a mechanism for testing complex circuitry of this type, a number of built-in self test (BIST) methodologies have been employed including level sensitive scan design (LSSD) techniques. LSSD design can be performed in accordance with the teachings of "Level Sensitive Logic System," U.S. Pat. No. 3,783,254, and "Method of Level Sensitive Testing A Functional Logic System," U.S. Pat. No. 3,761,695, both to Edward B. Eichelberger and of common assignee to this invention, the contents of which are incorporated herein by reference in their entireties.

In the LSSD methodology, a long string of shift register latches (SRLs) is employed in a dual function role which does not detract from normal circuit operation. In particular, a shift register (SR) string provides normal input during circuit operation and provides a mechanism for providing test input signals to the circuit for testing purposes. These tests may be employed, for example, immediately subsequent to chip manufacture, and in field test error conditions. Depending on the source of input signals to the SRL scan string, either normal operations or test operations can be carried out.

An important concept for grasping the present invention, is the notion of a "cone of logic." In any given logic circuit, there are input and output signal lines. Not every input line can generally influence every output signal line. Conversely, each output signal line is generally capable of being influenced only by a subset of input signal lines. Thus, each output signal line is associated with a cone of logic representing signal paths through which input signals influence the output signal. Furthermore, an input signal line can influence the output at more than one output signal line. Thus, one can associate with each output signal line a subset of input signal lines passing through and defining the cone of logic. One can associate with each input signal line a subset of output signal lines which can be influenced by the input signal present on any selected input signal line. For further discussion of logic cones, the reader is referred to "Delay Test Coverage Enhancement for Logic Circuitry Employing Level Sensitive Scan Design," U.S. Pat. No. 5,278,842, to Edward B. Eichelberger of common assignee to this invention, the contents of which is incorporated herein by reference in its entirety.

An example testing technique of VLSI logic chips, i.e. microprocessors, using pseudo-random pattern generation techniques, is logic built-in self test (LBIST). LBIST initializes a set of latches and generates a set of pseudo-random latch value patterns for all latches in a chip. A clock pulse scans the test pattern and the output is then compared to an expected result. Thereafter, a new set of latch values can be loaded into the latches. For further information regarding LBIST techniques, the reader is referred to "Self-Testing of Multichip Modules," by P. H. Bardell and W.H. McAnney, in Proceedings of the IEEE International Test Conference, 1982, pages 200–204, the contents of which is incorporated herein by reference in its entirety.

Weighted random pattern (WRP) testing uses circuitry added to a pseudo-random number generator to weight the inputs to the device under test to produce a greater number of ones or zeros. WRP is described at length in "Weighted Random Pattern Testing Apparatus and Method," U.S. Pat. No. 4,688,223, to Franco Motika and John A. Waicukauski, of common assignee to this invention, the contents of which is incorporated herein by reference in its entirety.

A new circuit testing technique called picosecond imaging circuit analyzer (PICA) captures weak, transient light pulses that are emitted by individual switching transistors through the backside of the chip. Airline passengers on a night flight can see the traffic of cities beneath them traced out by illumination from vehicles' headlights. In much the same way, chip designers using PICA can use light emitted by speeding electrons to examine the activity of circuits in computer chips. Electronic engineers can use PICA to spot problems in their circuit designs and manufacturing processes, and to debug chips.

Scientists have known since the 1980s that electrons emit light known as photons when they speed through field effect transistors (FETs), the building blocks of complementary metal-oxide-semiconductor (CMOS) microchips. Microprocessors and memory chips can be made from CMOS circuits. The electrons move only when the CMOS circuits change from one state to another, switching on or off. Detecting these very faint light emissions can be used to monitor the switching of individual components of advanced CMOS chips.

High-speed optical detectors can be used to monitor light emissions from simple high-speed circuits. A sophisticated detector can permit imaging and time-resolving light emission from hundreds or thousands of devices on a chip simultaneously. The PICA technique produces "movies" of information flowing through complex chips, such as microprocessors. The technique was named picosecond imaging circuit analysis because the pulses of light last for only picoseconds (trillionths of a second).

PICA technology led to a semiconductor testing tool with application in spotting and diagnosing faults in chips at the design and prototyping level.

PICA is a method for recording time and location of photon emission. PICA can be used for chip characterization including timing and clock skew. PICA can also be used for failure analysis such as for DC and timing fails. Few photons are generated per switch so a high repetition rate is needed for practicality. Thus, PICA can only be used today practically for clocking and scanning.

Chip innovations include increasing speed, decreasing size and new packaging styles. These innovations drive changes in the technologies needed to test and debug the chips. Such tests are critical for identifying failures and faults in chip designs and manufacturing.

One chip innovation involves wires that connect individual transistors. In earlier generations of chips, one or two layers of wiring connected the transistors, so that most of the transistors and wires were directly visible. More recently, however, the wiring on the chip is much more complex, leading to as many as seven levels of wiring. Bottom layers of wires and the transistors are often almost completely covered by the upper layers of wires. As a result, traditional methods of measuring electrical activity on a chip are becoming impractical. PICA can overcome this because it can look at the transistors through the backside of a chip, where no metal wires get in the way.

The reader is referred to the following documents further describing PICA techniques, J. C. Tsang and J. A. Kash, "Picosecond hot electron light emission from submicron complementary metal-oxide semiconductor circuits," Applied Physics Letters, Vol. 70, No. 7, Feb. 17, 1997, pages 889–891, J. A. Kash, J. C. Tsang, "Dynamic Internal Testing of CMOS Circuits using Hot Luminescence," IEEE Electron Device Letters, Vol. 18, 1997, pages 330–332, Dave Vallett, Dr. Jeff Kash, and Dr. Jim Tsang, "Watching Chips Work," MicroNews, Vol. 4, No. 1, First Quarter 1998, pages 23–25, J. A. Kash, J. C. Tsang, Richard F. Rizzolo, Atul K. Patel, and Aaron D. Shore, "Backside Optical Emission Diagnostics for Excess IDDQ," IEEE Journal of Solid-State Circuits, Vol. 33, No. 3, March 1998, pages 508–511, and D. Knebel, P. Sandra, D. Vallet, L. Huisman, P. Nigh, R. Rizzolo, P. Song, and F. Motika, "Diagnosis and Characterization of Timing-Related Defects by Time-Dependent Light Emission," Proceedings of 1998 IEEE International Test Conference, October 1998, pages 733–739, the contents of which are incorporated herein by reference in their entirety.

Unfortunately, PICA cannot conventionally be used in certain testing situations because the weak, transient light pulses of the circuits of the chips are undetectable. For example, LBIST and WRP test techniques cannot use PICA. PICA techniques require high repetition rates of specific test patterns in order to get a sufficiently good image. Test patterns that have worked well with PICA are clocking patterns and scan patterns, both of which have high repetition rates. Conventional standard chip test techniques such as LBIST and WRP do not have high repetition rates. Thousands of clocks must be applied to fully load a scan chain for each test pattern and only one clock may cause a fail in 100 or more patterns. The duty cycle can easily be less than 1/100,000. A circuit that fails during an LBIST or WRP test is simply not stimulated often enough to provide a PICA image. Therefore PICA, a valuable testing technique, can not presently be used for detecting LBIST and WRP fails.

What is needed then is a technique enabling sufficient exercise of LBIST and WRP failing chip circuits to permit identification using PICA testing techniques.

SUMMARY OF THE INVENTION

The present invention includes a method and system for testing integrated circuit chips, including the steps of performing a binary search to a first failing pattern, determining a failing sink latch, performing a back cone trace to determine all source latches, determining source latch logic states, positioning the source latch logic states in a scan chain, exercising a chip scan path by applying logic transitions on the source latches in the absence of a system L1 clock, generation of a synchronization signal to increase signal-to-noise ratio, and observing an exercised failing circuit.

In an embodiment of the invention, the method includes the steps of using PICA techniques to observe the exercised failing circuit.

In another embodiment of the invention, the method includes using at least one of an LBIST and a WRP technique to search for the failing pattern.

In yet another embodiment of the invention, the method includes the step of using an algorithm to exercise the failing circuit.

In yet another embodiment of the invention, the method includes the step of creating a net pattern to be scanned including a sum of an original pattern causing a failing circuit to be exercised, and one or more shifted versions of the original pattern.

In another embodiment of the invention, the algorithm can include a step where one of the shifted versions is shifted a number of clocks wherein the number of clocks is equal to the length of the original pattern.

In yet another embodiment of the invention, the algorithm can include step where one of the shifted versions is shifted a number of clocks, wherein the number of clocks is chosen so that the sum of the original pattern and the one of the shifted versions does not cause a scan conflict.

In another embodiment of the invention, the method further includes the step of using an algorithm to densify the pattern set.

In yet another embodiment of the invention, a synchonization or "shutter open" signal can be generated and provide a means for capturing only desired transitions with the PICA imaging system, increasing the signal-to-noise ratio.

Further features and advantages of the invention, as well as the structure and operation of various embodiments of the invention, are described in detail below with reference to the accompanying drawings.

BRIEF DESCRIPTION OF THE DRAWINGS

The foregoing and other features and advantages of the invention will be described with reference to the accompanying drawings. In the drawings, like reference numbers generally indicate identical, functionally similar, and/or structurally similar elements. Also in the figures, the left most digit of each reference number corresponds to the figure in which the reference number is first used.

DETAILED DESCRIPTION OF THE INVENTION

The preferred embodiment of the invention is discussed in detail below. While specific implementations are discussed, it should be understood that this is done for illustration purposes only. A person skilled in the relevant art will recognize that other components and configurations may be used without departing from the spirit and scope of the claimed invention.

Existing PICA techniques can require high repetition rates of specific test patterns in order to get a sufficiently good image. Test patterns that have worked well in the past are clocking patterns and scan patterns, both of which have high repetition rates. Standard chip test techniques such as Logic Built in Self Test (LBIST) and Weighted Random Patterns (WRP) do not in general have high repetition rates. Thousands of clocks must be applied to fully load a scan chain for each test pattern and one clock may cause a fail in 100 or more patterns. The duty cycle can easily be less than 1/100,000. A circuit that fails during an LBIST or WRP test is not stimulated often enough to provide a PICA image. Therefore PICA is not presently usable for LBIST and WRP fails.

The present invention is especially suited for PICA imaging. PICA is essentially an accumulated signal that accumulates light due to switching from transistors. The same methodology can apply to any measurement technique that accumulates signals, such as, e.g., an EBEAM type signal, where one excites a net with an EBEAM tool. When one uses PICA and exercises certain wires on a chip and transistors attached to them, i.e. everytime the transistors are switched, a little bit of light, e.g., 20 photons per switch, is produced. However 20 photons is to few to observe, so repetitive switching is required in order that a signal can be accumulated to be detectable over background noise. A good signal to noise ratio is needed. One needs to continually exercise a targeted circuit. PICA works successfully for clock signals, which can occur every couple nanoseconds.

When debugging logic however, transistors associated with the logic will not switch very often. One technique used to test transistors is LBIST. LBIST can scan a series of latches using, e.g., the LSSD technique, in which a number of clocks are used to initialize the chip through its latch scan path.

In an example, 1,000 clocks are needed to load the latches to switch (i.e. to cause a state transition from high voltage to low voltage) the targeted circuit or transistor. After 1000 clocks, the exact pattern to perform the switch is loaded in the latches and then the next clock causes the transistor to switch. Thus, with this example it can take 1000 clocks to perform one switch. Some types of faults that are investigated are transistors that switch improperly, that do not switch or that switch too slowly. With PICA one looks for transistors that switch too slowly.

With a clock type signal, a signal is accumulated once every nanosecond or every couple of nanoseconds, i.e. relatively often. After approximately one second, about one half a billion to a billion switches have occurred, accumulating a very good signal.

With LBIST on the other hand, the signal is much less strong, e.g., 1/1000 of that, or even much less. The technique of the present invention can be used to increase the rate of switching by a targeted transistor. WRP also does not have a very high repetition rate and can similarly benefit.

The present invention attempts to increase the rate of switching in order to make PICA imaging viable with low repetition signals such as, e.g. LBIST and WRP.

The present invention extracts a failing pattern and replicates it in a fashion that can decrease the exposure time several orders of magnitude making the PICA imaging technique fully practical for LBIST and WRP failure diagnostics.

Overview of the Invention

Figure 1A:
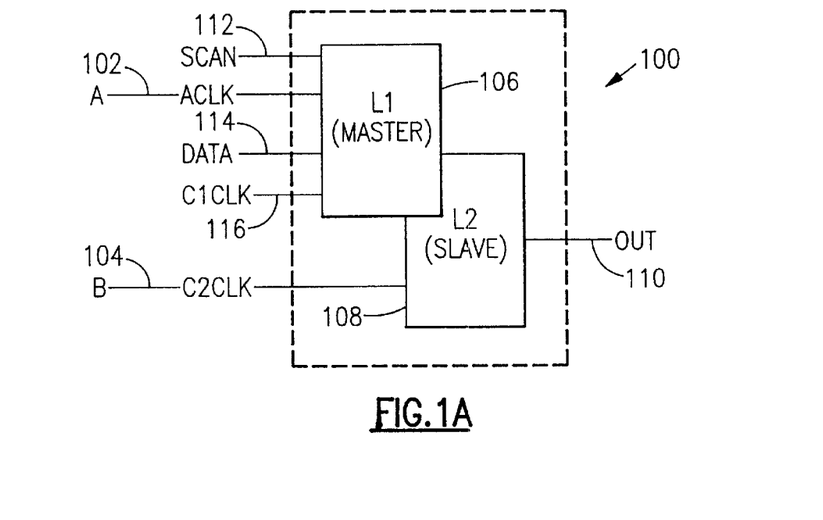
FIG. 1A depicts an exemplary latch.

From standard diagnostic techniques commonly available in the art, a list of potentially defective circuits can be obtained. There are usually special circuits on chips called latches that capture and hold onto a signal. FIG. 1A depicts an exemplary latch 100. Since the proper state of a latch is known, a false signal can be identified. Problems in a latch are indicative of a fault in that latch or in a circuit before that latch.

FIG. 1A illustrates example latch 100 including L1 master 106 having A CLK 102 which is used to latch data on scan port 112 into the L1 master latch 106, and C1CLK 116 which is used to latch data from data port 114 into the L1 master latch 106. B CLK 104 is used to latch data from L1 master 106 to L2 slave 108, which in turn has an output port 108. When both A CLK 102 and B CLK 104 are both active, scan port 112 is flushed to out 110.

Figure 2:
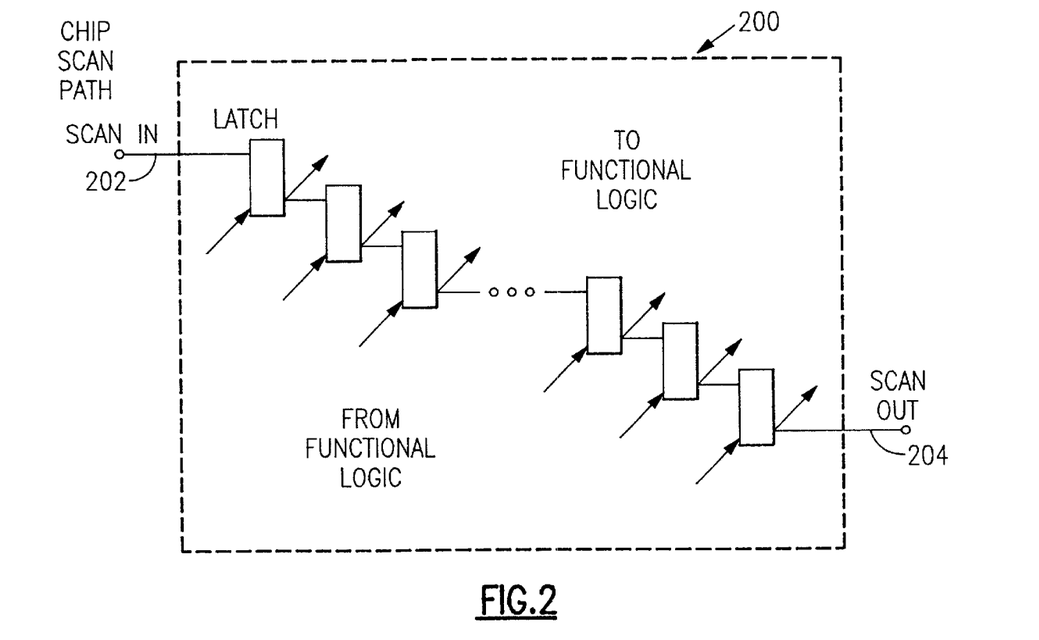
FIG. 2 depicts an exemplary serial chip scan chain path.
Figure 2A:
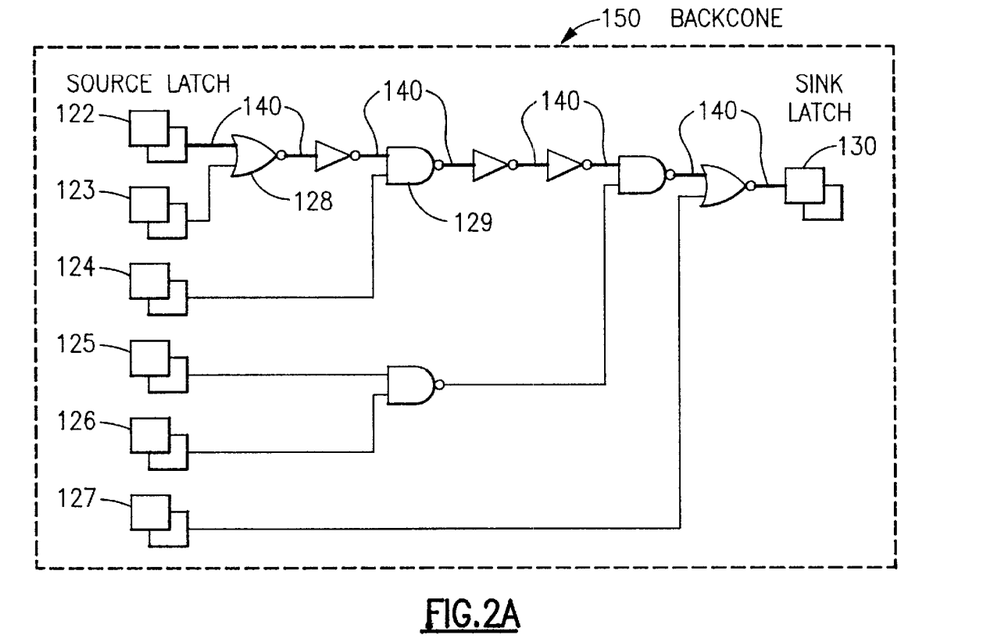
FIG. 2A depicts an exemplary logical back cone from sink latch to source latches.

FIG. 2A depicts an exemplary back cone 150 illustrating source latches 122, 123, 124, 125, 126, and 127 which connect through various combinational logic blocks to sink latch 130. The back cone is the set of all combinational logic blocks and source latches which can influence the state of sink latch 130. Generally, there are no latches allowed between a sink latch and a source latch. An exception is if that intervening latch can be forced into a combinational logic mode independent of the source and sink latch. A logic path 140 from source latch 122 to sink latch 130 is also illustrated. Exemplary logic blocks 128 and 129 are in path 140. If during testing a false signal is captured in the sink latch, the most probable location for a defect is in the the sink latch or circuits in the back cone of that sink latch.

Figure 3A:
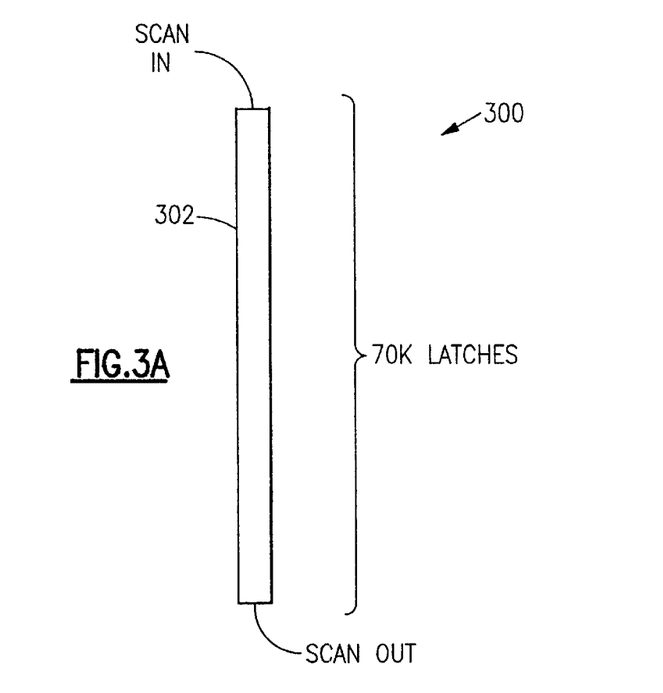
FIG. 3A illustrates an example diagram including a a single long chain of latches serially connected and clocked in a scan path with one switch observed after the final latch is scanned.
Figure 3B:
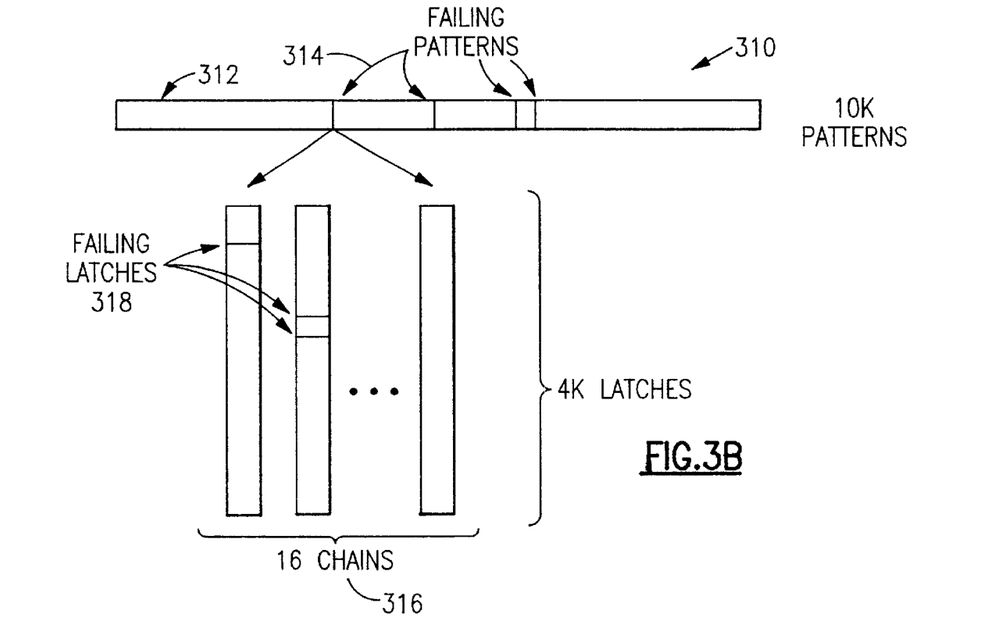
FIG. 3B illustrates an example diagram of a weighted random pattern test sequence showing failing patterns, chip latches configured into 16 parallel scan chains of 4K latches each, and failing latches causing the failing pattern.
Figure 3C:
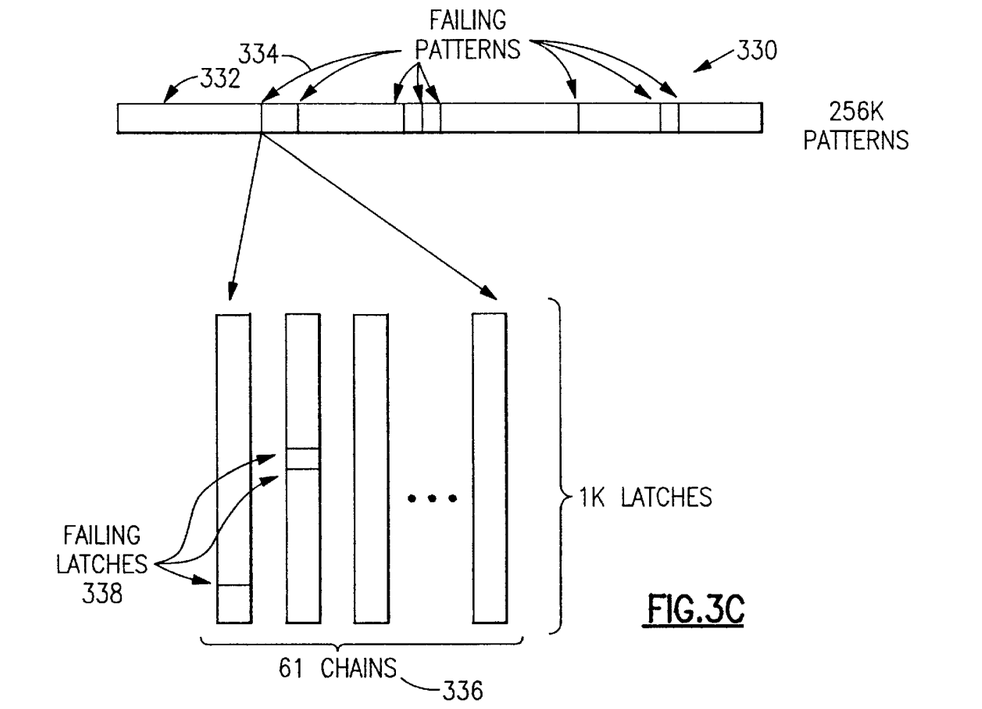
FIG. 3C illustrates an example diagram of an LBIST pattern test sequence showing failing patterns, chip latches configured into 61 parallel scan chains of 1K latches each, and failing latches causing the failing pattern.

Referring to FIGS. 3a, 3b, and 3c, present techniques including LBIST are described. FIG. 3a illustrates diagram 300 showing a long chain 302 that in this example includes all 70K latches on the chip. In order to activate the failing path (cause a switch in the failing circuit) approximately 70K clocks are needed to set all latches to propagate a transition through the failing logic block. A "clock" in this example refers to one or more transitions on the scan clock line to define the state of every latch. This duty cycle, one switch per 70K clocks, is far too little for practical PICA exposure times. In most test modes, the long scan chain is divided into smaller chains that are loaded in parallel. This speeds the loading of the chain and hence the test time.

In weighted random pattern (WRP) test mode (FIG. 3b), the long chain is divided into 16 smaller WRP chains 316 of approximately 4K latches each that can be scanned in parallel. These chains are accessable through chip inputs and outputs. Each test "pattern" requires approximately 4K clocks to load all latches. A exemplary WRP test sequence 312 may consist of 10K patterns. In a failing chip only some of these patterns may fail, i.e., a sink latch will not have the expected value. The first failing pattern 314 contains failing latches 318. In the present state-of-the-art, the first failing test pattern is extracted and continuously repeated to exercise the failing circuit. Since there is only one switch of the failing circuit guaranteed every 4K clocks, the repetition rate is not enough to enable observing using PICA techniques. Typical PICA repetition rates are one switch every clock.

In yet another test mode, Logic Built-In Self Test (LBIST—FIG. 3c), the long chain is divided into 61 chains 336 of approximately 1K latches each. Each test pattern requires approximately 1K clocks to load all latches. A exemplary LBIST test sequence 332 may consist of 256K patterns. In an LBIST test, the individual latch states are not measured every cycle but are compressed into a Multiple Input Signature Register (a MISR). If at the end of the test, the MISR does not have the correct signature, then some pattern failed. Because of the scan chain configuration and signature compression, LBIST is a very efficient test, and most chip logic faults are tested with LBIST. Diagnosing LBIST fails, is important but difficult and there are multiple steps to determine the first failing pattern 334 and the failing latches 338. Unfortunately, there is no ability to access the 61 scan chains from chip inputs and outputs. Even if there were access, there would be only one switch of the failing circuit guaranteed every 1K clocks, still not enough to make PICA a practical diagnostic technique.

Figure 4:
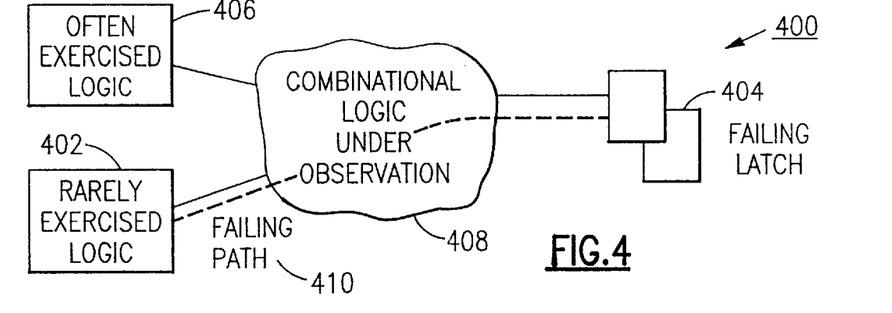
FIG. 4 depicts an example diagram including rarely exercised logic, combinational logic under observation, a failing sink latch and often exercised logic.

FIG. 4 depicts a situation that can arise even if PICA sensitivity can be increased to observe, e.g., one switch every thousand clocks. In general, multiple paths can propagate transitions through a logic circuit. Some of these paths may be exercised fairly often during LBIST, e.g. once every few clock cycles, and some exercised rarely. In this case, the PICA signal due to path from 406 switching may "drown out" the PICA signal due to the path from 402 switching because the optical signal due to path 406 switching may accumulate thousands of times faster. The generation of a "synchronization signal", part of this invention, directs the observing equipment to observe only during the targeted switching time.

For each failing latch, a path that ends up at that sink latch can be identified. The path is identified in order to be able to exercise the path to cause the latch to switch. Timed paths on a chip are launched from one latch circuit and end up at another latch circuit. A certain fixed time interval is required for a signal to propagate from one latch to another latch. The first latch is a source latch and the second latch is a sink or capture latch. Problems are identified in a sink or capture latch, when a wrong value is identified. The path can be traced back from the capture latch, backward through the logic, called a "back cone trace" to determine all source latches 122–127, that could possibly influence the sink latch 130, through whatever logical connections there are, known as a "back cone" 150 or a "logic cone." The sink latch identifies the problem, but there can be more than one source latch that leads into the sink latch. One can attempt to identify all the source latches that are connected into the sink latch. Part of the LSSD design technique causes all source latches and sink latches to be connected in a serial chain, i.e. to be connected one to another in a daisy chain. One knows the positions of all latches in the chain. Once all source latches are identified and their positions in the chain, then from the failing circuit it can be identified what was in those latches to cause the fail. Those latches can then be exercised with only those patterns that were in the source latches to cause the fail.

A so-called "scan-in" 202 operation loads all source latches through the serial chain. A chip scan path 200 is depicted in FIG. 2 from scan in 202 to scan out 204. A scan in operation step by step loads data into all source latches. When the data is in the proper position, it causes a switch in the logic that winds up at a sink latch. Normally there are 1000's of latches in a scan chain, such as 100,000 latches. In a cone there may only be six latches involved in a cone as in FIG. 2A, i.e. a smaller number. So the method of the present invention attempts to only exercise those latches that will exercise the failing sink latch. In any test one needs to provide a certain number of clocks to get to the point that all latches are loaded. This is referred to as the initialization pattern. Once the initialization pattern is applied, a much fewer number of clocks is needed to stimulate the source latches. If source latches are adjacent in the scan chain, a minimum number of clocks are needed, in this example only seven clocks. So instead of getting one switch every, e.g., 100,000 clocks, there would be one switch every seven clocks.

In the event that the latches are separated from one another, then there are other techniques disclosed in this invention, devised to exercise the targeted failing transistor.

Different algorithms can be used to exercise the targeted transistor by loading a set of source latches that meet non-conflict criteria as described below with reference to FIGSs. 6–9. The scan chain modulo can then be loaded with the selected latches such that there is no conflicting data.

Then the chain can then continue to be scanned, applying only A and B clocks. No functional clocks are needed to capture data because the circuit is exercised repetitively, and sufficiently to permit visual observation using PICA techniques.

Figure 5:
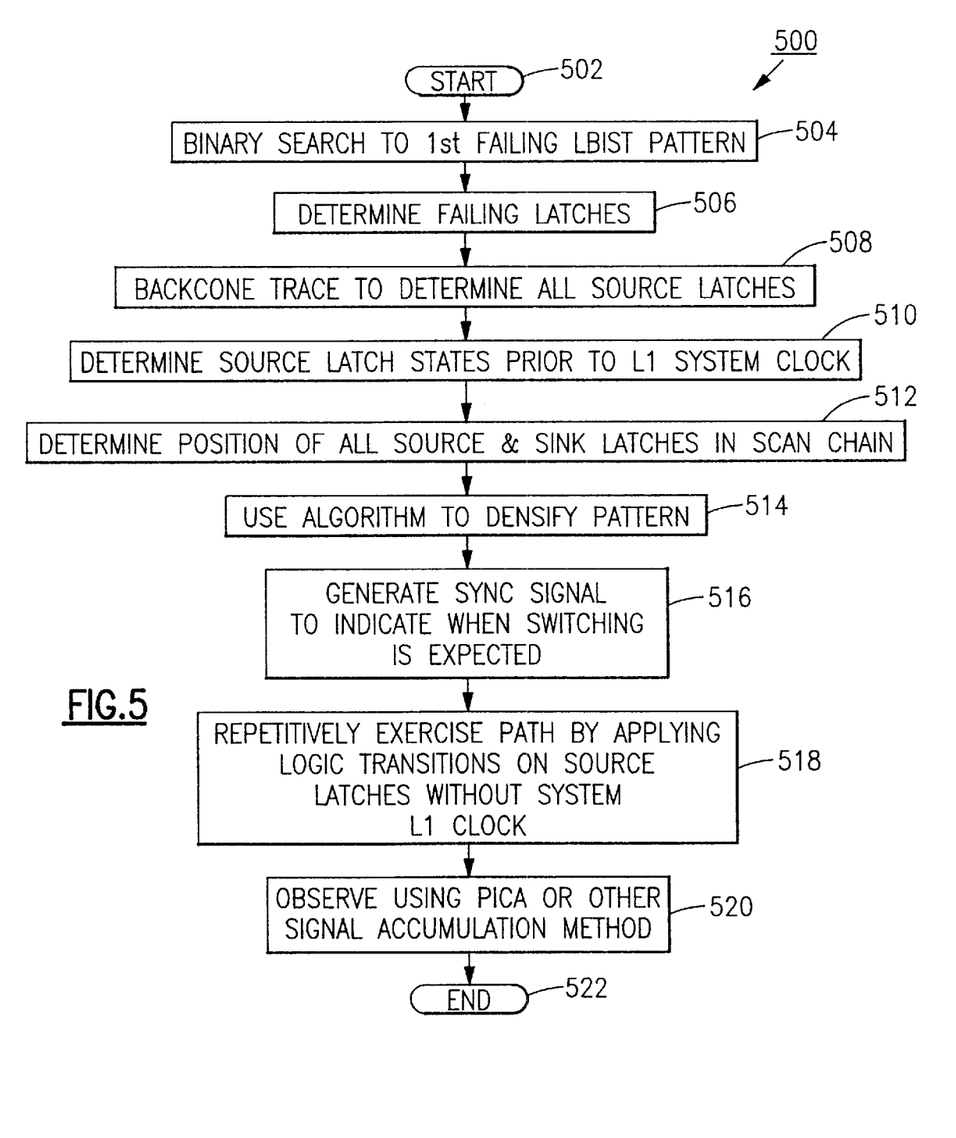
FIG. 5 illustrates an example technique of the present invention detailing an example process including various optional steps.

The present invention is now described in greater detail with reference to an example process flowchart 500 depicted in FIG. 5, illustrating an example technique of the present invention. Flowchart 500 begins with step 502 and continues immediately with step 504.

In step 504, a binary search can be performed to a first failing LBIST pattern. From step 504, flowchart 500 can continue with step 506.

In step 506, the failing latch or latches can be determined. From step 506, flowchart 500 continues with step 508.

In step 508, a back cone trace can be performed to determine all possible source latches. From step 508, flowchart 500 can continue with step 510.

In step 510, the source latch logic states prior to the system clock can be determined. From step 510, flowchart 500 can continue with step 512.

In step 512, the position of the source latches in the scan chain can be determined. From step 512, flowchart 500 can continue with step 514.

In step 514 an algorithm can be used to densify the pattern set. From step 514, flowchart 500 can continue with step 516.

In step 516, a synchronization or "shutter open" signal can be added to the pattern set to indicate to the PICA synchronization circuitry that the suspect circuit is about to be exercised. This synchronization signal can be used to increase the signal-to-noise ratio of the PICA result.

From step 516, flowchart 500 can continue with step 518.

In step 518, the path can be exercised by applying logic transitions on the source latches without a system L1 clock. From step 518, flowchart 500 can continue with step 520.

In step 520, the exercised targeted circuit can be observed. From step 520, flowchart 500 can immediately end with step 522.

Figure 6:
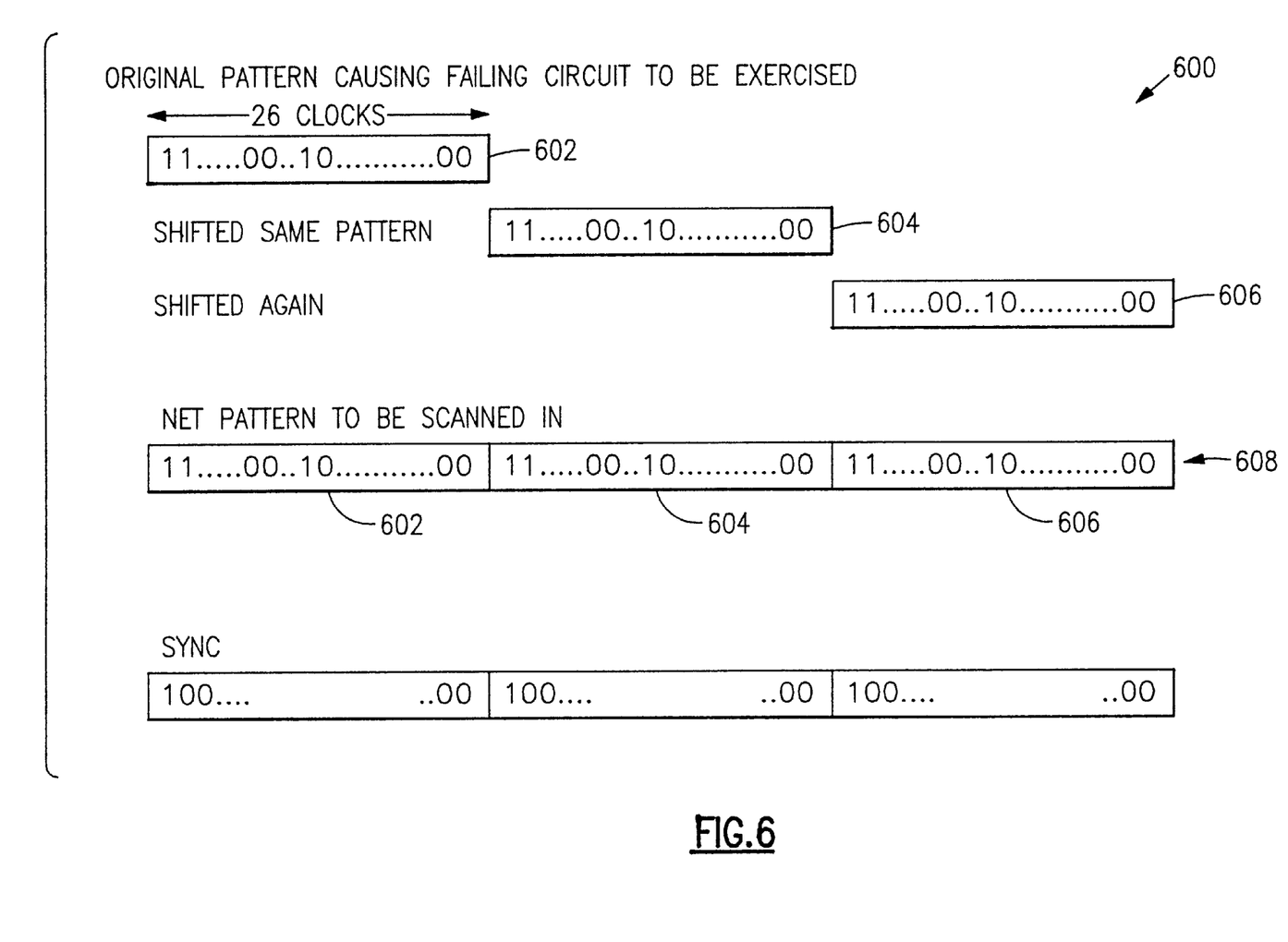
FIG. 6 illustrates a first algorithm which can be used to exercise the failing circuit and the generation of a synchronization signal to indicate to the external measuring equipment (i.e. PICA) when switching is expected.

FIG. 6 illustrates a first algorithm 600 which can be used to exercise the failing circuit. Algorithm 600 is a simple means of exercising the targeted transistor, the failing circuit which takes the original pattern 602 causing the failing circuit to be exercised, in this example, 26 clocks (which is much less than thousands of clocks), and shifts the pattern the length of the original pattern, and shifting again, as often as needed to meet a desired repetition rate. Algorithm 600 illustrates two shifts 604 and 606 which can be combined with pattern 602 to form net pattern 608 which can then be scanned in. A minimum repetition rate is dependent only on how close the latches are in the scan chain. In the example shown in FIG. 6, a 1/26 duty cycle is observed, and 1/n is the duty cycle in the general case where n is the numerical difference between the latches furthest apart in the scan chain that must be set. A "sync" signal is generated every time the proper scan pattern is present that will cause the desired switching activity.

Figure 7:
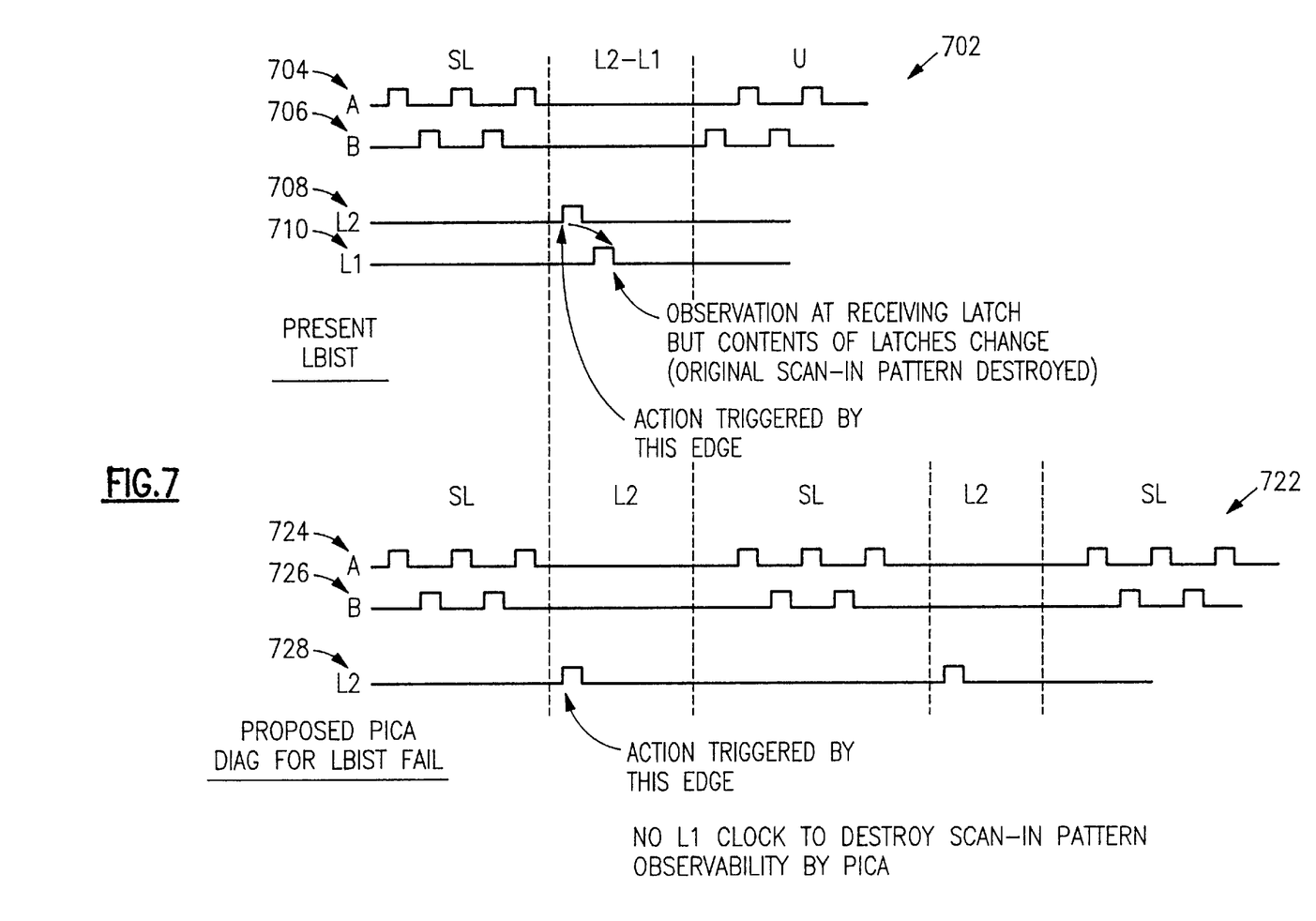
FIG. 7 depicts an example comparison between a present LBIST system and an embodiment of the proposed PICA technique of the present invention for identifying LBIST fails and other non-highly repetitive fails.

FIG. 7 depicts a comparison between the clocking of a present LBIST test for delay faults 702 and the proposed PICA technique 704 of the present invention for identifying LBIST fails. In the present state of the art test for delay fails, the data is scanned into all latches with scan clocks A 702 and B 706 in such a way that after the scan is complete the L1 and L2 latches can contain opposite states. This is called a skewed load indicated by s1. The following L2 clock pulse 708 captures data from the L1 into the L2 and simultaneously launches data from the L2. This causes a logical transition, or switch, to propagate through combinational logic blocks to various capture latches. The following L1 clock pulse 710 captures that data in the L1 of those latches. A scan out operation or unload indicated by u can propagate that captured data to either a scan output pin on the chip or compress it into a MISR. Timing tests are done by varying the timing between the L2 clock pulse and the L1 clock pulse. Observation is done by monitoring the scan out or the MISR. The combined L2 and L1 clock pulses destroy any data that was scanned into all latches.

In this invention technique 722 the clocks are modified. The same skewed load A-B sequence 724,726 is applied and the same L2 clock 728 is applied to initiate the transition propagation. The following L1 clock is omitted, however, because observability at the scan out or MISR is not necessary and it is desirable to keep the scan data intact. This enables unlimited repetition of the scan data and the associate switching caused by it. The Sync signal is generated during the same period of time as the L2 clock 728. Thus the state transition switch can be observed by PICA.

Figure 8:
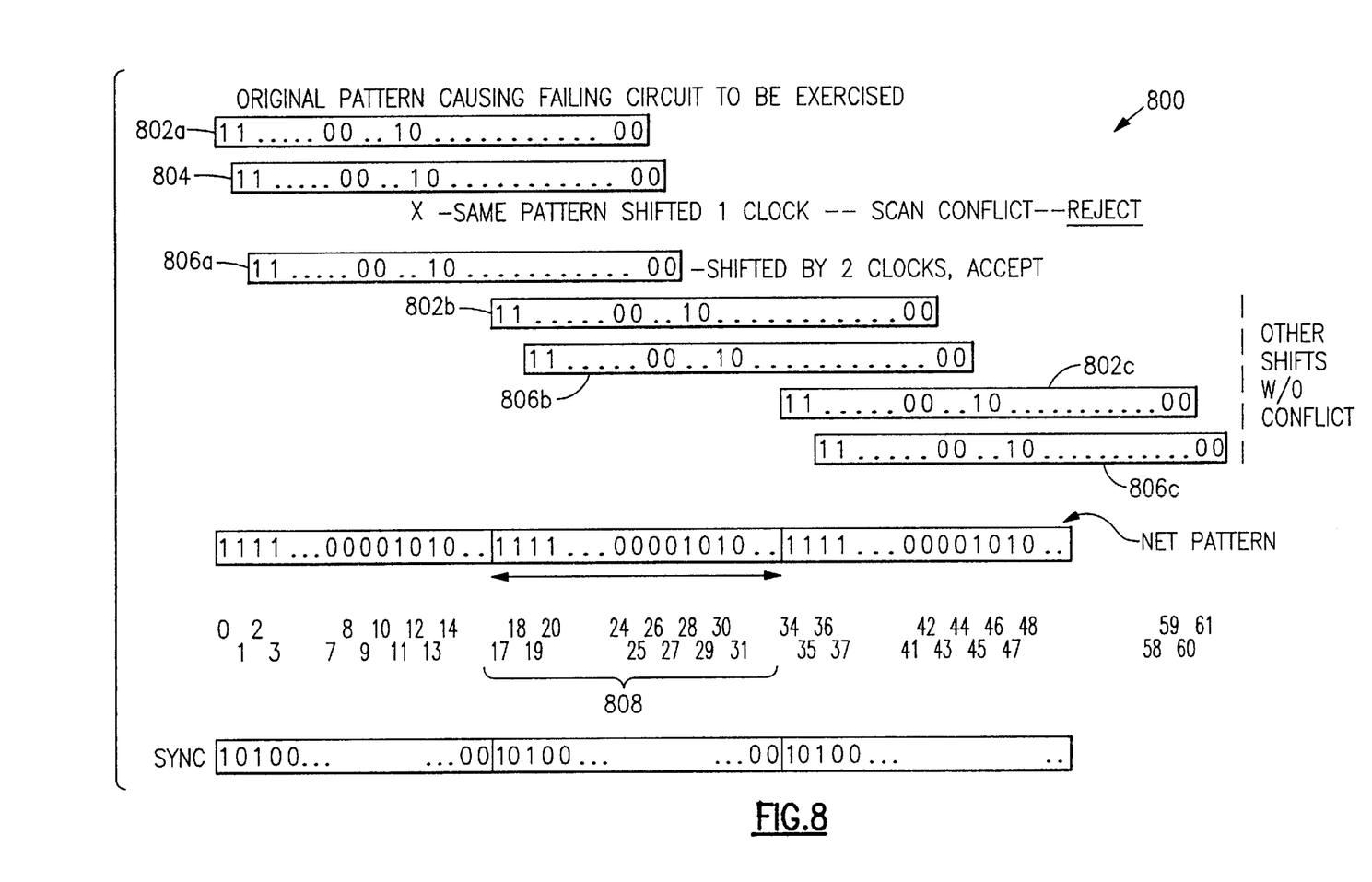
FIG. 8 depicts an alternative exemplary algorithm including an original pattern causing the failing circuit to be exercised.

FIG. 8 depicts an alternative algorithm 800. Algorithm 800 includes original pattern 802*a* causing the failing circuit to be exercised. Dotted positions are don't care states. Shifted pattern 804 is rejected because of a scan conflict at position 12, after shifting original pattern 802*a* one clock. Shifted pattern 806*a*, shifted 2 clocks, is acceptable since no scan conflict is observed. Other shifted patterns 802*b*, 806*b*, 802*c* and 806*c* are also accepted since they create no conflicts. A repeating net pattern 808 is observed by combining the resulting acceptable shifted patterns 802*a–c* and 806*a–c*. A SYNC signal generation can be used to identify the start of an active switching pattern to measuring equipment. The SYNC signal generation can be used to increase signal-to-noise ratio. The SYNC signal generation can also be used to avoid monitoring switching through other paths.

Scanning in pattern 808 continuously will result in a higher repetition rate (approximately 1/10 in this special example embodiment), but much higher than using algorithm 600, in most cases.

Figure 9A:
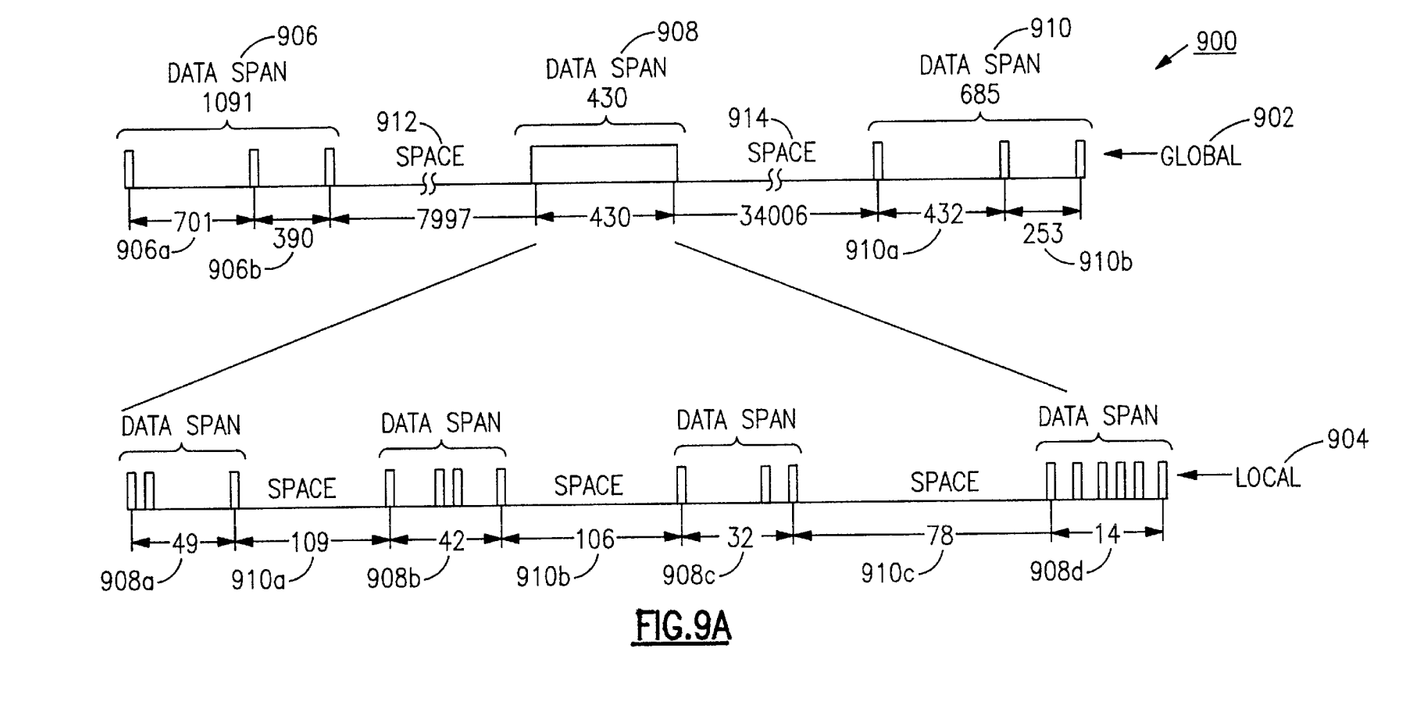
FIG. 9A illustrates an example group interleave diagram.

FIG. 9A illustrates group interleave diagram 900 depicting an alternative embodiment of the invention. As with the algorithm of FIG. 8, it is desirable that a pattern be shifted and repeated. How much you can shift latches can depend on the concentration of the latches in a big scan chain. A number of latches, such as, e.g., 16 latches, can be near together in some cases, known as a data span 906, 908 and 910, shown in FIG. 9A. Data span 908 includes a large number of concentrated data spans 908*a*, 908*b*, 908*c* and 908*d*. Far away from data span 908 are data spans 906 and 910. In one embodiment of the invention, it can be easier to treat a group of close together latches, e.g., data spans 908*a*, 908*b*, 908*c* and 908*d,* as a single span 908. Once data spans have been determined, the process of creating a shift and repeat such as, e.g., described in FIG. 8, can be followed.

Figure 9B:
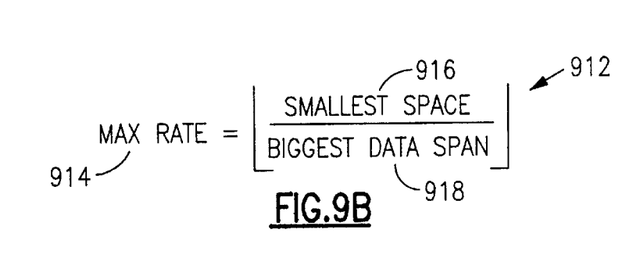
FIG. 9B illustrates an exemplary equation demonstrating the maximum rate is equal to the quotient of the quantity of smallest space divided by the biggest data span.

FIG. 9B illustrates equation 912 demonstrating the maximum rate 914 is equal to the quotient of the quantity of smallest space 916 divided by biggest data span 918, further illustrated in diagram 900. Group interleave diagram 900 includes data spans 906, 908, and 910 of global pattern 902. Global pattern 902 also includes spaces 912 and 914 separating data spans 906 and 908, and 908 and 910, respectively. Data span 906 includes span portions 906*a* and 906*b*, and data span 910 includes span portions 910*a* and 910*b*. Local Data span 908 includes data spans 908*a*, 908*b*, 908*c* and 908*d* separated as shown by spaces 910*a*, 910*b* and 910*c*.

Figure 10:
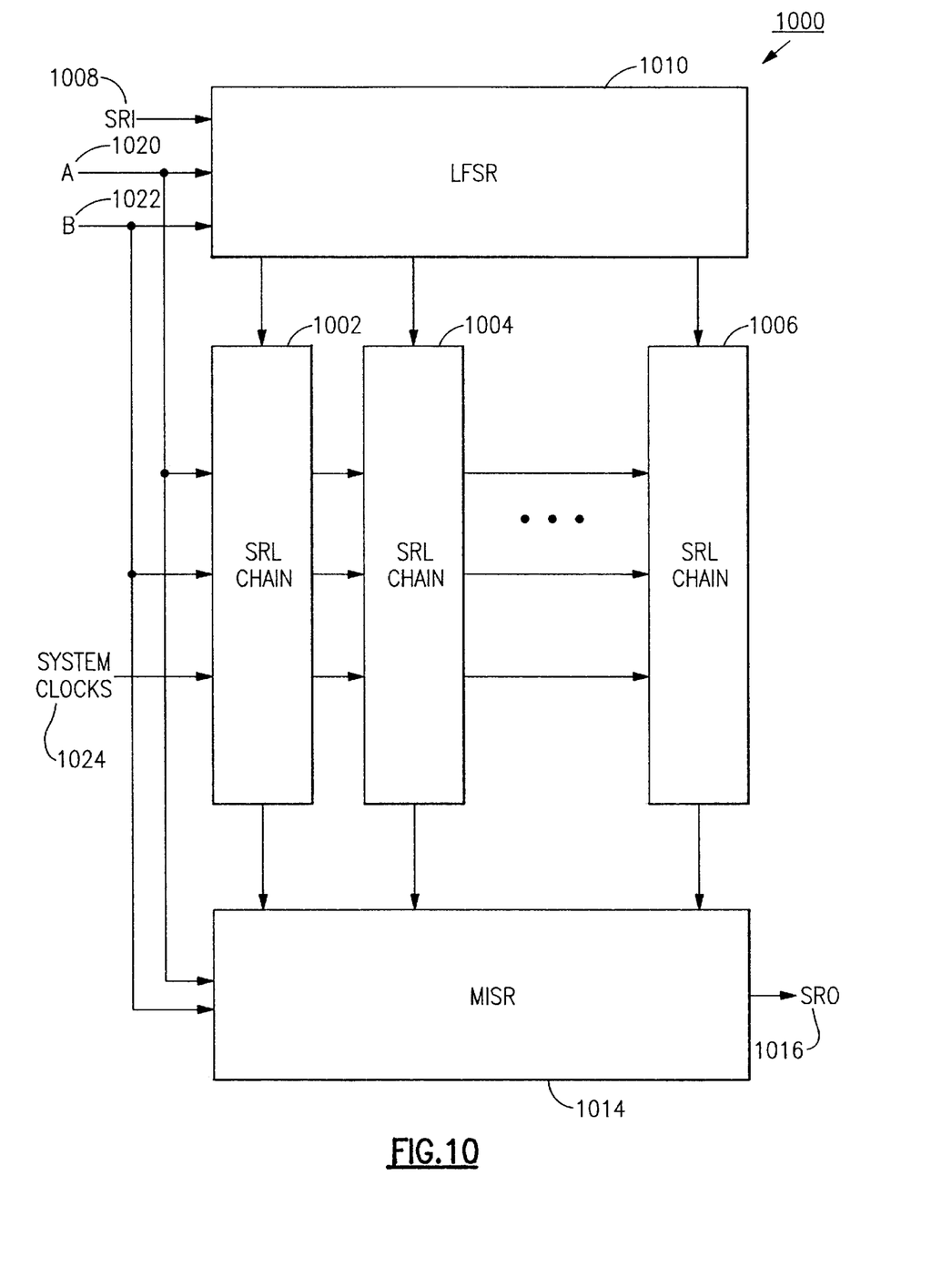
FIG. 10 depicts an example diagram of an LBIST configuration including a Linear Feedback Shift Register (LFSR), a Multiple Input Signature Register (MISR), an A clock, a B clock, and system clocks coupled to parallel shift register latch (SRL) chains.

FIG. 10 depicts a diagram 1000 including an A clock 1020, a B clock 1022 and system clocks 1024 coupled to parallel shift register latch (SRL) chains 1002, 1004 and 1006. It would be apparent to those skilled in the art that additional SRL chains (not shown) can also be included in diagram 1000. A linear feedback shift register 1010, coupled to the SRL chains, is also coupled to a level sensitive scan design (LSSD) shift register string scan input (SRI) 1008, the A clock 1020 and the B clock 1022. A multiple input signature register (MISR) 1014, is coupled to SRL chains 1002, 1004 and 1006, and to A clock 1020 and B clock 1022 and output at a shift register string scan-out port (SRO) 1016. The output 1016 can be further analyzed by, e.g., a signature analyzer (SA).

Each test can load a test vector into the shift register latches (SRLs) and can cycle through each of the machine clocks, using A and B clocks 1020 and 1022, to capture the test responses in the internal shift register latches, and finally unload the device to MISR 1014 and the SR string through SRO 1016.

All latches are connected in daisy chains in this example embodiment. It will be apparent to those skilled in the art that it is not necessary for the invention to have all latches in one chain. In another embodiment of the invention, multiple chains such as those depicted in FIG. 10, work fine. In an embodiment of the invention, it is essential that the latches be loadable and readable via "scan" ports, such as, e.g., scan in port 202 and scan out port 204. In practice, these scan ports are chip inputs and outputs at the ends of the chain. An example latch and scan path are depicted in FIG. 1 and FIG. 2 respectively, described above with reference to the figures.

Latch positions as depicted in FIGS. 6 and 8 and Tables 1–4 below, include dots, where each dot represents a latch position. In order to completely initialize the chip, all latches can be loaded with data from the scan in port 202. A pair of clocks (A 102,B 104) are needed to scan data into each latch (the B clock 104 is connected to the C2 clock port on the latch). If the scan chain is "n" latches long, then "n" A,B clock pairs are needed to initialize the chip. Initialization is required before chip logic built in self-test (LBIST).

TABLE 1

| scan in ...................................................... scan out |
|---|

It has been described above how one determines which latch fails. Suffice it to say that whenever there is a failure on chip due to a defective circuit, most often only a small amount of logic is affected. Only a finite number of latches need to be set up to exercise the fault, and the faulty result will only show up on a finite number of latches. A first step is to identify the possible source latches by a backwards trace through the logic from the failing sink latches 124. Table 2 below represents the position in the scan chain of the source latches implicated in the fail.

TABLE 2

| scan in ...........................................A........B...C.....D. scan out |
|---|

We know the failing test pattern via standard diagnostic techniques. The test pattern for a delay test (the most general case) is a two pattern sequence. The first pattern is the initial state of the latch and the second is the final state. Suppose that the failing pattern is that latch A stays at a "1" level, latches B and C stay at a "0" level, and latch D switches from a 1 to a 0. The state of those latches can be represented as shown in Table 3.

TABLE 3

| scan in | ...........................................A........B...C.....D. scan out |
|---|---|
| cyc n | ...........................................1........0...0.....0. |
| cyc n + 1 | ...........................................1........0...0.....1. |

Every time there is a new A,B clock pair, the pattern above in Table 3 shifts to the right and the cycle counter (the "n") is incremented. In order to get the pattern shown at cycle n+1 of Table 3, the pattern at cycle n has an additional requirement—it includes the pattern at n+1 shifted to the left by 1. The pattern below in Table 4 meets both the requirements for the initial and final states of the latches. When the next A,B clock pair is applied (shifting the pattern to the right) the latches will switch in a way to recreate the fail.

TABLE 4

| scan in | ...........................................A........B...C.....D. scan out |
|---|---|
| cyc n | ...........................................11.......00..00....10. |

In the existing state of the art, all latches must be scanned in LBIST, and only one switch of the defective circuit is guaranteed even if you have isolated to the failing pattern. Several hundred to several thousands of clocks may be needed to create the conditions for the switch. This low repetition rate results in excessively long exposure times severely limiting the utility of the diagnostic. In addition, all test patterns in the present state of the art are oriented towards verifying function by capturing responses in existing latches and scanning out. In order to capture the response immediately after cycle n+1, a system clock is applied to every latch, which captures data on the functional data port of every latch. The captured data can then be scanned out and compared to what is expected. A general LBIST delay test loop involves a scan-in operation to set up the data, a timed capture operation, and a scan out. In table 5 below the A and B clocks are the same as in FIG. 7. The B and C clocks in the capture region are the same as L2 and L1 clocks.

TABLE 5

| scan in | capture | scan-out |
|---|---|---|
| ABABABA........... | BC........... | BABABAB |

The "C" or L1 system clock that captures data, captures it for all latches on the chip and overwrites what was in the scan chain. An essential part of the pattern creation aspect of this invention is the "C" is left out. This leaves the scan data intact and enables unlimited repetition of the switching pattern.

One simple algorithm is shift and repeat as already described above with reference to FIG. 6. Again, every clock causes these patterns to shift to the right. This causes three switches, at which time the faulty path will be exercised. A "sync" signal is generated every time the proper pattern is generated indicating to the PICA circuitry when the switching is expected. In a chain of length L with a "span" of S latches between the source latches furthest apart, the exposure time multiplier is S/L (e.g. a 4,000 latch chain with a span of 40 latches gets an exposure time multiplier of 0.01x—a 10 hour exposure is reduced to 6 minutes).

TABLE 6

```
scan in   ............................................A.......B...C.....D.  scan out
cyc n     ............................................11......00..00....10.  orig pattern
cyc n     11......00..00....1011......00..00....1011......00..00....10.  densified
sync      1..................1.............................1...................  w/shift &
                                                                              repeat
```

The other algorithms depicted in FIGS. 8 and 9A involve various forms of interleave. To illustrate, the interleave below in Table 7, switches six times in the same number of clocks. In the general case, this interleave strategy can provide a lower exposure time multiplier.

TABLE 7

```
scan in   ............................................A.......B...C.....D.  scan out
cyc n     ............................................11......00..00....10.  orig pattern
cyc n     ........................................11......00..00....10...  shift -2
cyc n     ......................................11......00..00....10.....  shift -4
cyc n     ................11......00..00....10............................  shift -24
cyc n     ..............11......00..00....10..............................  shift -26
cyc n     ............11......00..00....10................................  shift -28
cyc n     ............111111..000000000101010111111..0000000000101010.  net pattern
sync      ............1.1.1.................1.1.1........................
```

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method for testing integrated circuit chips, comprising:
   identifying a sink latch of interest;
   performing a back cone trace to determine all source latches in response to said sink latch;
   determining source latch logic states;
   positioning said source latch logic states in a scan chain;
   exercising a chip scan path by applying logic transitions on said source latches in the absence of a system capture clock such that said chip scan path is repetively exercised by said logic transitions; and
   observing an exercised circuit.

2. The method according to claim 1, wherein said observing comprises:
   using PICA techniques to observe said exercised circuit.

3. The method according to claim 1, wherein said identifying comprises:
   using at least one of an LBIST and a WRP technique to search for said sink latch of interest.

4. The method according to claim 1, wherein said exercising comprises:
   using an algorithm to exercise said exercised circuit.

5. The method according to claim 4, wherein said algorithm includes creating a net pattern to be scanned including a sum of an original pattern causing a circuit to be exercised, and one or more shifted versions of said original pattern.

6. The method according to claim 5, wherein one of said shifted versions is shifted a number of clocks wherein said number of clocks is equal to the length of said original pattern.

7. The method according to claim 5, wherein one of said shifted versions is shifted a number of clocks, wherein said number of clocks is chosen so that said sum of said original pattern and said one of said shifted versions does not cause a scan conflict.

8. The method according to claim 5, further comprising:
   using an algorithm to densify said net pattern.

9. The method according to claim 5, wherein a synchronization signal is generated identifying every shifted version of the original pattern such that the measuring device only measures during that period of time when switching is expected to be caused by that pattern.

10. The method according to claim 1, wherein said identifying includes:
    performing a search to a first failing pattern; and
    determining a sink latch of interest in response to said first failing pattern.

11. The method according to claim 1, wherein said observing comprises:
    using voltage e-beam techniques to observe said exercised circuit.

12. A system comprising an integrated circuit chip, said system that tests integrated circuit chips, comprising:
    a testing apparatus that identifies a sink latch of interest;
    a tracer that traces a back cone of logic that determines all source latches in response to said sink latch;
    a source latch logic state determinator responsive to said tracer;
    a scan chain configured to position said source latch logic states therein;
    a chip scan path exerciser that applies logic transitions on said source latches in the absence of a system capture clock responsive to said scan chain such that said chip scan path is repetively exercised by said logic transitions; and
    a device that observes an exercised circuit responsive to said exerciser.

13. The system of claim 12, wherein the system comprises at least one of a one chip device and a multiple chip module (MCM).

14. A system comprising an integrated circuit chip, said system comprising means for testing integrated circuit chips, comprising:

means for identifying a sink latch of interest;
means for performing a back cone trace to determine all source latches in response to said sink latch;
means for determining source latch logic states;
means for positioning said source latch logic states in a scan chain;
means for exercising a chip scan path by applying logic transitions on said source latches in the absence of a system capture clock such that said chip scan path is repetively exercised by said logic transitions; and
means for observing an exercised circuit.

* * * * *